(12) United States Patent
Hall et al.

(10) Patent No.: US 8,988,099 B2
(45) Date of Patent: Mar. 24, 2015

(54) ON-LINE TIME DOMAIN REFLECTOMETER SYSTEM

(75) Inventors: Nelson Hall, Kent, WA (US); William R. Stagi, Burien, WA (US)

(73) Assignee: UTILX Corporation, Kent, WA (US)

( * ) Notice: Subject to any disclaimer, the term of this patent is extended or adjusted under 35 U.S.C. 154(b) by 866 days.

(21) Appl. No.: 12/820,886

(22) Filed: Jun. 22, 2010

(65) Prior Publication Data
US 2011/0043244 A1 Feb. 24, 2011

Related U.S. Application Data

(60) Provisional application No. 61/219,289, filed on Jun. 22, 2009.

(51) Int. Cl.
*G01R 31/40* (2014.01)
*G01R 19/00* (2006.01)
*G01R 31/11* (2006.01)

(52) U.S. Cl.
CPC ..................... *G01R 31/11* (2013.01)
USPC .................. 324/764.01; 324/76.11

(58) Field of Classification Search
CPC ............ G01R 31/011; G01R 31/021; G01R 31/1272; G01R 31/11; G01R 31/088; G01R 27/06; G01R 31/024; G01R 31/2837; G01R 27/2617; G01R 31/1245; G01M 3/165
USPC .................. 324/532–534, 637–638, 642–646
See application file for complete search history.

(56) References Cited

U.S. PATENT DOCUMENTS

| | | | |
|---|---|---|---|
| 5,521,512 A | 5/1996 | Hulina | |
| 6,677,761 B1 * | 1/2004 | Greulich | 324/533 |
| 7,164,274 B2 * | 1/2007 | Pharn et al. | 324/534 |
| 7,206,703 B1 * | 4/2007 | Papageorgiou et al. | 702/58 |
| 7,679,371 B1 * | 3/2010 | Lo | 324/533 |
| 7,880,476 B1 * | 2/2011 | McKenzie et al. | 324/543 |
| 2004/0124854 A1 * | 7/2004 | Slezak | 324/644 |
| 2007/0085550 A1 * | 4/2007 | Wu et al. | 324/533 |
| 2008/0048668 A1 * | 2/2008 | Mashikian | 324/533 |

FOREIGN PATENT DOCUMENTS

| | | |
|---|---|---|
| JP | 2003-214809 A | 1/2002 |
| JP | 2004-064754 A | 2/2004 |

OTHER PUBLICATIONS

Dubickas, V., et al. "On-line Time Domain Reflectometry Measurements of Temperature Variations of an XLPE Power Cable," IEEE Conference on Electrical Insulation and Dielectric Phenomena, Kansas City, MO, Oct. 15-18, 2006, pp. 47-50.

International Search Report mailed Jan. 28, 2011, in corresponding International Patent Application No. PCT/US2010/039540, filed Jun. 22, 2010.

Office Action mailed Apr. 1, 2013, issued in a corresponding Korean Application No. 10-2012-7001565, filed Jun. 22, 2010, 6 pages.

* cited by examiner

*Primary Examiner* — Vinh Nguyen
(74) *Attorney, Agent, or Firm* — Christensen O'Connor Johnson Kindness PLLC

(57) ABSTRACT

A number of TDR systems and testing methods are provided that improve the quality and accuracy of information collected when propagating a signal along a length of cable in order to pinpoint specific anomalies. One or more of the TDR systems includes, for example, a computing device, a pulse generator, and at least one capacitive test sensor. The at least one capacitive test sensor transmits/receives pulses to/from a power system component, such as an insulated power cable, in a capacitive manner.

10 Claims, 4 Drawing Sheets

ON-LINE TIME DOMAIN REFLECTOMETER SYSTEM

CROSS-REFERENCE TO RELATED APPLICATION

This application claims the benefit of U.S. Provisional Application No. 61/219,289, filed Jun. 22, 2009, which is hereby incorporated by reference.

BACKGROUND

Transmission cables are intended to operate safely and effectively over lifespans exceeding twenty years. However, because of anomalies in the transmission cable due to manufacturing defects, installation errors, localized imperfections, such as insulation breakdown, transmission cables often suffer premature breakdown. Should this occur during a critical period the repercussions in terms of financial losses and customer inconveniences can be quite severe. Therefore, with the ever-increasing number of transmission cables being utilized throughout the world, it is desirable that anomalies such as faults, discharges, cable damage, and splices of transmission cables be located without the necessity of physical tracing and inspection.

A Time Domain Reflectometer (TDR) is one apparatus that can be used to analyze a cable for anomalies, and more specifically, to analyze the cable for changes in cable impedance in order to locate such anomalies. A typical TDR transmits a pulse of electrical energy onto a cable that includes two conductors separated by a dielectric material. When the pulse encounters a change in the impedance of the cable, part of the pulse's energy is reflected back toward the TDR. The amplitude and polarity of this reflection is proportional to the change in impedance. Such reflections are usually displayed in graphical form on the screen of a typical TDR whereby a technician can interpret the results and locate specific cable anomalies. In particular, the time of propagation of the pulse as well as the pulse shape can be used to identify and locate the anomaly along the transmission cable.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with an embodiment of the present disclosure, an apparatus for testing an electrical power system for anomalies is provided. The apparatus includes a computing device, a pulse generator that generates a pulse upon reception of a command signal from the computing device, and one or more capacitive test sensors capable of being capacitively coupled to an on-line power component of the electrical power system. At least one of the one or more capacitive test sensors receives the pulse generated by the pulse generator.

In accordance with another embodiment of the present disclosure, a method of testing a power system component for anomalies is provided. The method comprises capacitively coupling one or more test sensors to an on-line insulated power cable, generating a test pulse and transmitting the test pulse to at least one test sensor of the one or more test sensors, capacitively transmitting the test pulse from the at least one test sensor of the one or more test sensors onto the insulated power cable so that the test pulse travels along the insulated power cable, and capacitively receiving a reflected pulse by one test sensor of the one or more test sensors from the insulated power cable. The reflected pulse results from the test pulse interfacing with an anomaly along the insulated power cable.

In accordance with another embodiment of the present disclosure, a method of testing a power system component for anomalies is provided. The method comprises connecting, in electrical communication, a pulse transmission line with a test sensor housed in a power cable termination elbow. The test sensor is housed in the termination elbow disposed with the termination elbow in such a manner as to be capacitively coupled to a power cable when the power cable is connected to the termination elbow. The method also includes generating a test pulse and transmitting the test pulse to the test sensor via the pulse transmission line, capacitively transmitting the test pulse from the test sensor onto the power cable so that the test pulse travels along the power cable, and capacitively receiving a reflected pulse by the test sensor from the power cable. The reflected pulse results from the test pulse interfacing with an anomaly along the power cable or an electronic component connected to the power cable.

DESCRIPTION OF THE DRAWINGS

The foregoing aspects and many of the attendant advantages of this disclosure will become more readily appreciated by reference to the following detailed description, when taken in conjunction with the accompanying drawings, wherein.

DETAILED DESCRIPTION

Figure 1:
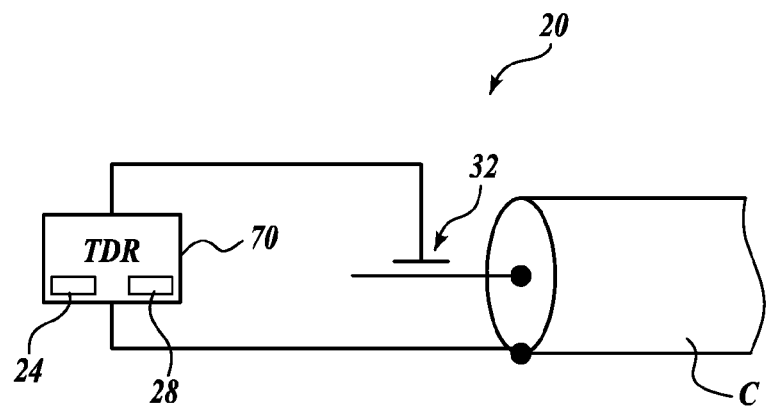
FIG. 1 is a schematic diagram of one embodiment of a TDR system formed in accordance with aspects of the present disclosure.

The detailed description set forth below in connection with the appended drawings where like numerals reference like elements is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result.

The following discussion proceeds with reference to examples of transmission cable testing devices and methods. More particularly, embodiments of the present disclosure are directed to systems and methods that utilize Time Domain Reflectometers (TDRs) for testing, and potentially analyzing, insulated transmission cables, such a medium and low voltage power transmission cables, twisted cable pairs, coaxial cable, etc., power equipment, such as switchgears, transformers, electric motors, etc., and the like As will be explained in more detail below, some embodiments of the present disclosure provide a TDR system that tests an "on-line" or "energized" power transmission cable by imposing a pulse of energy onto the power cable and sensing the potential reflection signals in a capacitive manner. In this way, technicians do not need to take the power cable off line nor do they need access to the power cable's central conductor.

As described herein, a Time Domain Reflectometer (TDR) transmits a pulse of electrical energy onto a transmission cable, such as a power transmission cable, that includes two conductors, a power carrying conductor, and a neutral conductor, separated by a dielectric material. When the electrical pulse encounters an impedance change along the cable's length, part of the pulse's energy is reflected back toward the TDR. By measuring, for example, the amplitude and polarity of the reflected wave, the proportionality of the impedance change can be determined. Additionally, by measuring the time of propagation of the pulse, the location of the impedance change can also be determined. Typical anomalies that will cause an impedance change include but are not limited to a change in the cable medium, splices, faults, neutral corrosion, water damage to the insulation and/or shield, and damage to the cable (e.g., broken conductors, shorted conductors, smashed cables, cuts, etc.)

In the following description, numerous specific details are set forth in order to provide a thorough understanding of exemplary embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

In accordance with several embodiments of the present disclosure, a number of TDR systems are provided that improve the quality and accuracy of information collected when propagating a signal along a length of transmission cable in order to pinpoint specific anomalies. Turning now to FIG. 1, there is shown a schematic diagram of a conventional transmission cable, such as a power cable C. As best shown in FIG. 1, the power cable C is being tested by one embodiment of a TDR testing system, generally designated 20, formed in accordance with aspects of the present disclosure. In some embodiments, the TDR testing system may be utilized to test "energized" or "on-line" power cables C. As used herein, the term "energized" or "on-line" means that power is presently being transmitted along the power cable C.

Still referring to FIG. 1, the system 20 comprises a computing unit 24, a pulse generator 28, and a pulse transmit/receive sensor 32. In use, the pulse generator 28, upon instructions generated by the computing unit 24, generates a pulse of energy that is transmitted over the power cable C via the transmit/receive sensor 32. If the pulse encounters an anomaly as it propagates down the power cable C, a reflection signal is produced and transmitted back toward the transmit/receive sensor 32, where the signal is sensed by the transmit/receive sensor 32 and transmitted to the computing unit 24 to be processed and displayed. In one embodiment, the signals received by the computing unit 24 may be analyzed to determine the location of the anomaly, the type of the anomaly, etc.

Figure 2:
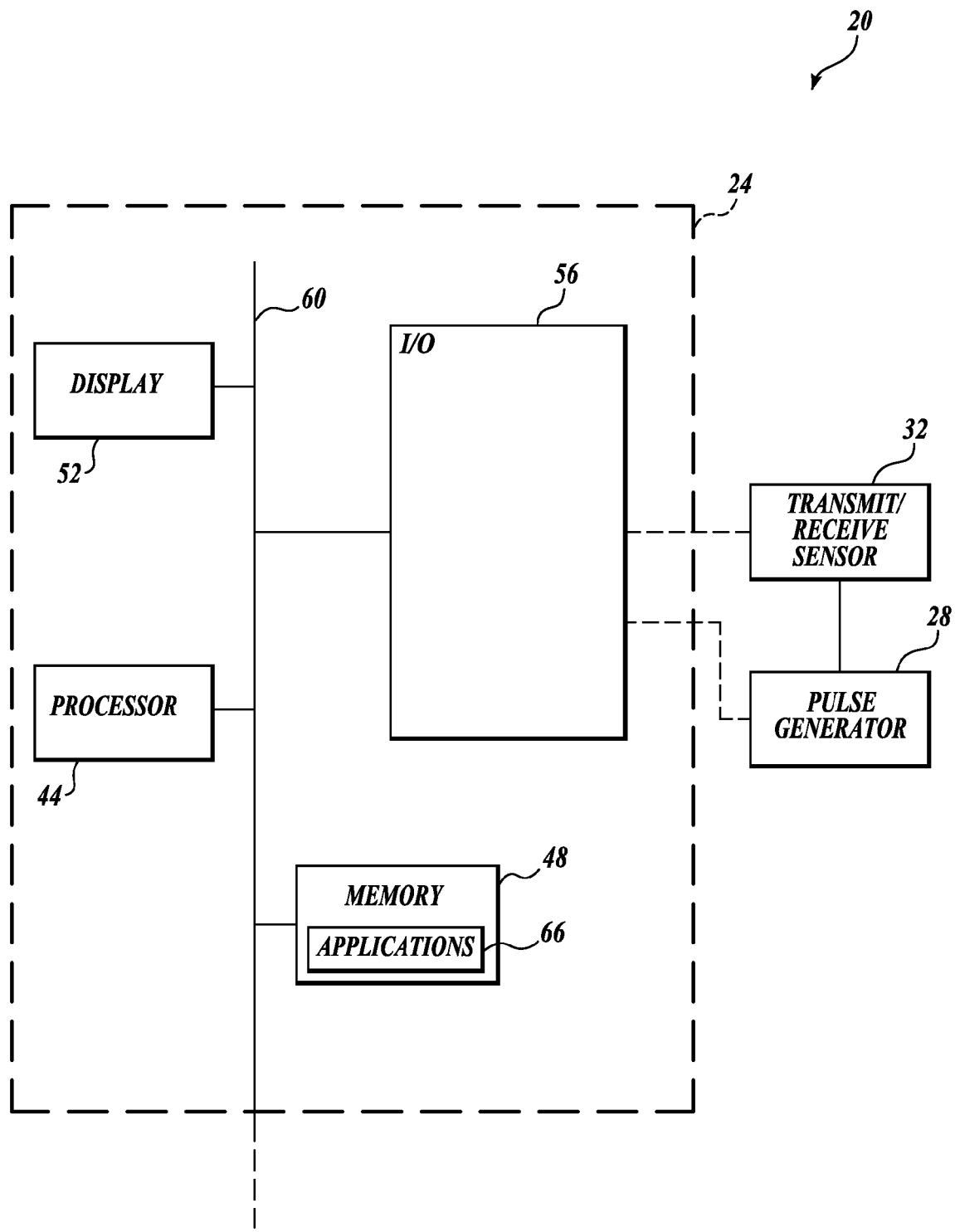
FIG. 2 is a block diagram of one embodiment of a computing device employed by the TDR system of FIG. 1.

Referring to FIGS. 1 and 2, the components of the system 20 will now be described in more detail. As briefly described above, the sensor 32 transmits a pulse of energy generated by the pulse generator 28, and then senses any reflections of the transmitted pulse. The sensor 32 may be a portable sensor for in-field data acquisition and/or testing or fixed in place at a termination location, such as a termination elbow. In one embodiment, the sensor 32 is a portable, capacitive probe, such as a U-shaped metallic (e.g., copper, etc.) probe. In use, the capacitive probe is capacitively coupled to the power cable C, at a position, for example, where the power cable is terminated. In embodiments that are testing underground power cables, the capacitive probe is capacitively coupled to the power cable C at a location where the power cable is exposed (e.g., above ground, unearthed, etc.). Once coupled to the power cable, the probe is capable of imposing a pulse onto the power cable to be tested and sensing the reflection signals due to anomalies and transmitting these signals to the computing unit 24 for displaying, processing, and/or storage, etc.

Referring now to FIG. 2, there is shown a block diagram of one embodiment of the computing unit 24 suitable for use with the system 20. The computing unit 24 comprises a processor 44, a memory 48, a display 52, and an I/O device 56 suitably interconnected via one or more buses 60. The memory 48 may include read only memory (ROM), random access memory (RAM), and storage memory. Examples of ROM include a programmable ROM (PROM), an erasable programmable ROM (EPROM), and an electrically erasable PROM (EEPROM). Examples of storage memory include flash memory, a hard disk drive, a magnetic disk drive for reading from or writing to a removable magnetic disk, and an optical disk drive for reading from or writing to a digital versatile disc (DVD), a compact disc rewriteable (CD-RW), etc. The storage memory and their associated computer-readable media provide non-volatile storage of computer readable instructions, data structures, program modules, and data received from the sensor 32. As used herein, the term processor is not limited to integrated circuits referred to in the art as a computer, but broadly refers to a microcontroller, a microcomputer, a microprocessor, a programmable logic controller, an application specific integrated circuit, and other programmable circuits, among others.

A number of program modules may be stored in storage memory, including one or more application programs 66, and program data. One application program generates a control signal to be transmitted to the pulse generator 28 to instruct the pulse generator 28 to generate a pulse of energy. In one embodiment, the control signal could be simply a trigger signal. This application or a separate application may keep track of the time between the generation of the pulse and the reception of any reflection signals, sometimes referred to as the time of propagation, and may calculate the velocity of propagation, if desired.

A technician may enter commands and information into the computing device 24 through input devices (not shown) such as a keyboard, joystick, potentiometers, switches, etc, which communicate with I/O device 56. The I/O device 56 also communicates with the sensor 32 for receiving signals therefrom. In one embodiment, the computing unit 24, the pulse generator 28, and optional input device, are housed in a unitary handheld TDR device 70, as shown in FIG. 1. The TDR device 70 is appropriately connected to the neutral conductor of the power cable C.

In use, when the one or more applications are implemented, either manually by input from a technician or automatically via instructions by the processor 44 (e.g., time based instructions) a pulse is generated at the pulse generator 28 and propagated down the power cable C via the sensor 32. The sensor 32 is then able to detect any reflection which occurs due to a change in impedance on the power cable C. As the wave reflections are detected, the one or more applications receive pulse information from the sensor 32 and assimilate the information to be displayed in a graphical representation on the display 52 in the time domain. The technician of the system 20 is then able to interpret information from the graphical representation of the anomalies detected on the power cable C.

Figure 3:
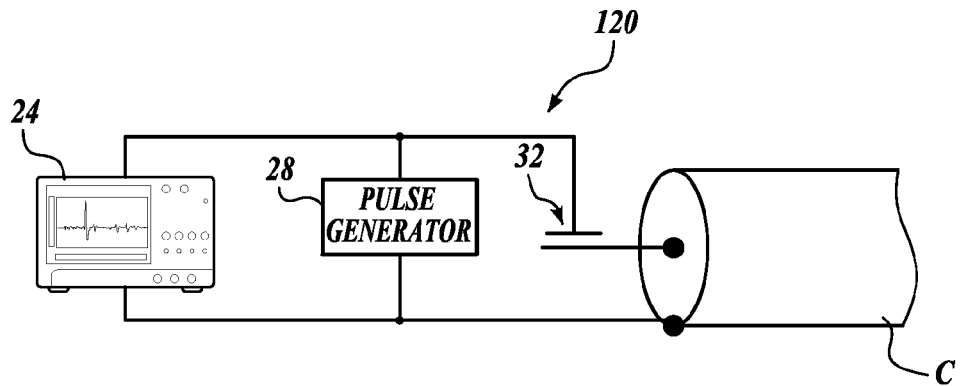
FIG. 3 is a schematic diagram of another embodiment of a TDR system formed in accordance with aspects of the present disclosure.

Turning now to FIG. 3, there is shown another embodiment of a TDR testing system, generally designated 120, formed in accordance with aspects of the present disclosure. The system 120 is substantially similar to the system 20 except for the differences that will now be explained. As best shown in FIG. 3, instead of the pulse generator 28 being integral with the TDR device 70, along with the computing device 24, the pulse generator 28 may be a separate component, which is electrically coupled to computing device 24 to receive controls signals therefrom. In one embodiment, the pulse generator 28 is a current source pulse generator and is electrically coupled to the transmit/receive sensor 32 so as to provide the pulse generator 28 with a high output impedance. In one embodiment, the output impedance of the pulse generator 28 is greater than 500 ohms. In another embodiment, the output impedance of the pulse generator 28 is greater than 1000 ohms.

Figure 4:
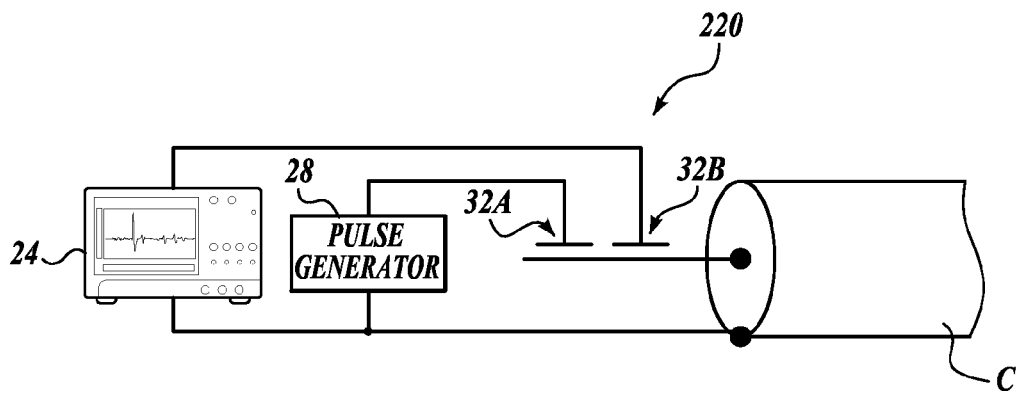
FIG. 4 is a schematic diagram of another embodiment of a TDR system formed in accordance with aspects of the present disclosure.

Turning now to FIG. 4, there is shown another embodiment of a TDR testing system, generally designated 220, formed in accordance with aspects of the present disclosure. The system 220 is substantially similar to the system 120 except for the differences that will now be explained. As best shown in FIG. 4, the system 220 includes separate capacitively coupled transmit and receive sensors 32A and 32B. The transmit sensor 32A is connected in electrical communication with the pulse generator 28 for transmitting a pulse of energy along the power cable C. The receive sensor 32B is connected in electrical communication with the computing device 24. In one embodiment, the pulse generator 28 is a voltage source pulse generator and is electrically coupled to the transmit sensor 32A so as to provide the pulse generator 28 with a low output impedance.

Figure 5:
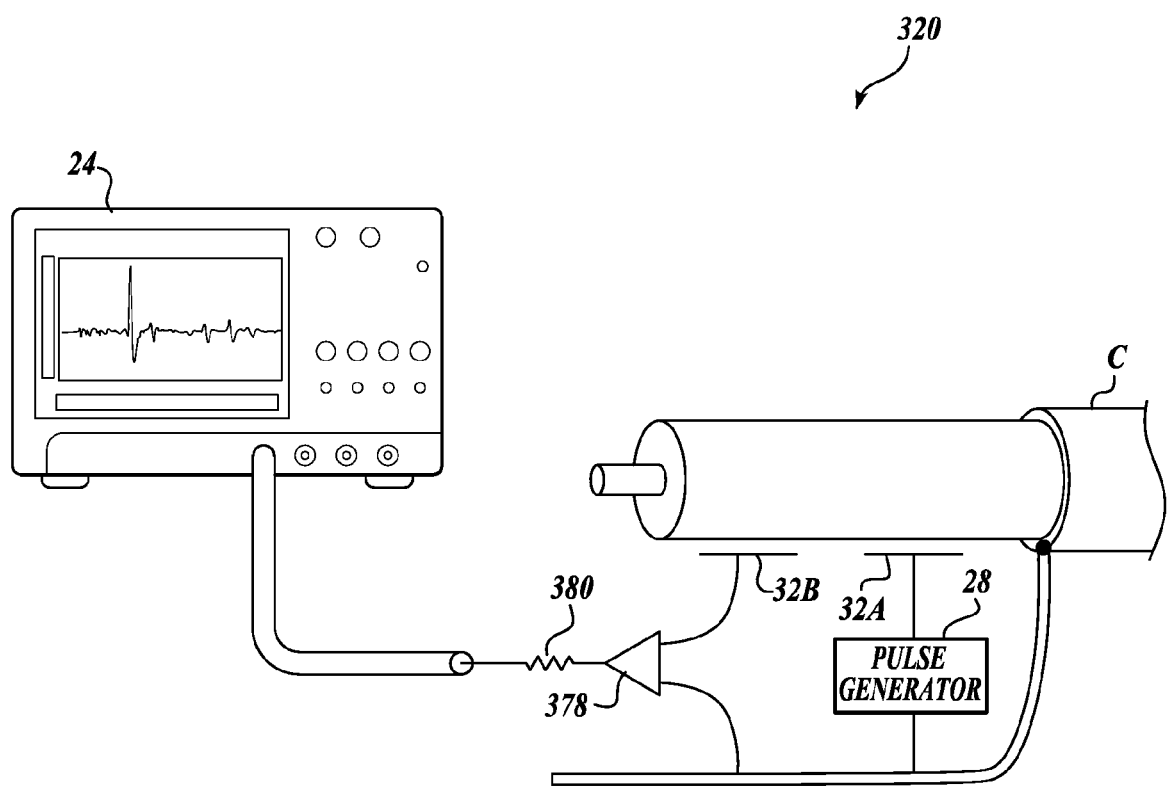
FIG. 5 is a schematic diagram of another embodiment of a TDR system formed in accordance with aspects of the present disclosure.

Turning now to FIG. 5, there is shown another embodiment of a TDR testing system, generally designated 320, formed in accordance with aspects of the present disclosure. The system 320 is substantially similar to the system 220 except for the differences that will now be explained. As best shown in FIG. 5, an amplifier 378 is electrically connected between the capacitive receive sensor 32B and the computing device 24. In one embodiment, the amplifier 378 has a high input impedance. In one embodiment, the input impedance is more than 500 ohms. This reduces the signal loss through the sensor's capacitive connection resulting in an improved received signal to noise ratio. In another embodiment, the signal transmission line between the amplifier 378 and the receive sensor 32B is less than or equal to about 2 inches. This eliminates any transmission line effects between the sensor 32B and the display which would corrupt the shape of the received signal. A termination matching resistor 380, such as a 50Ω resistor, may also be employed to drive the 50Ω transmission line connected to the display's 50Ω input impedance. This maintains the signal integrity by eliminating signal reflections.

Figure 6:
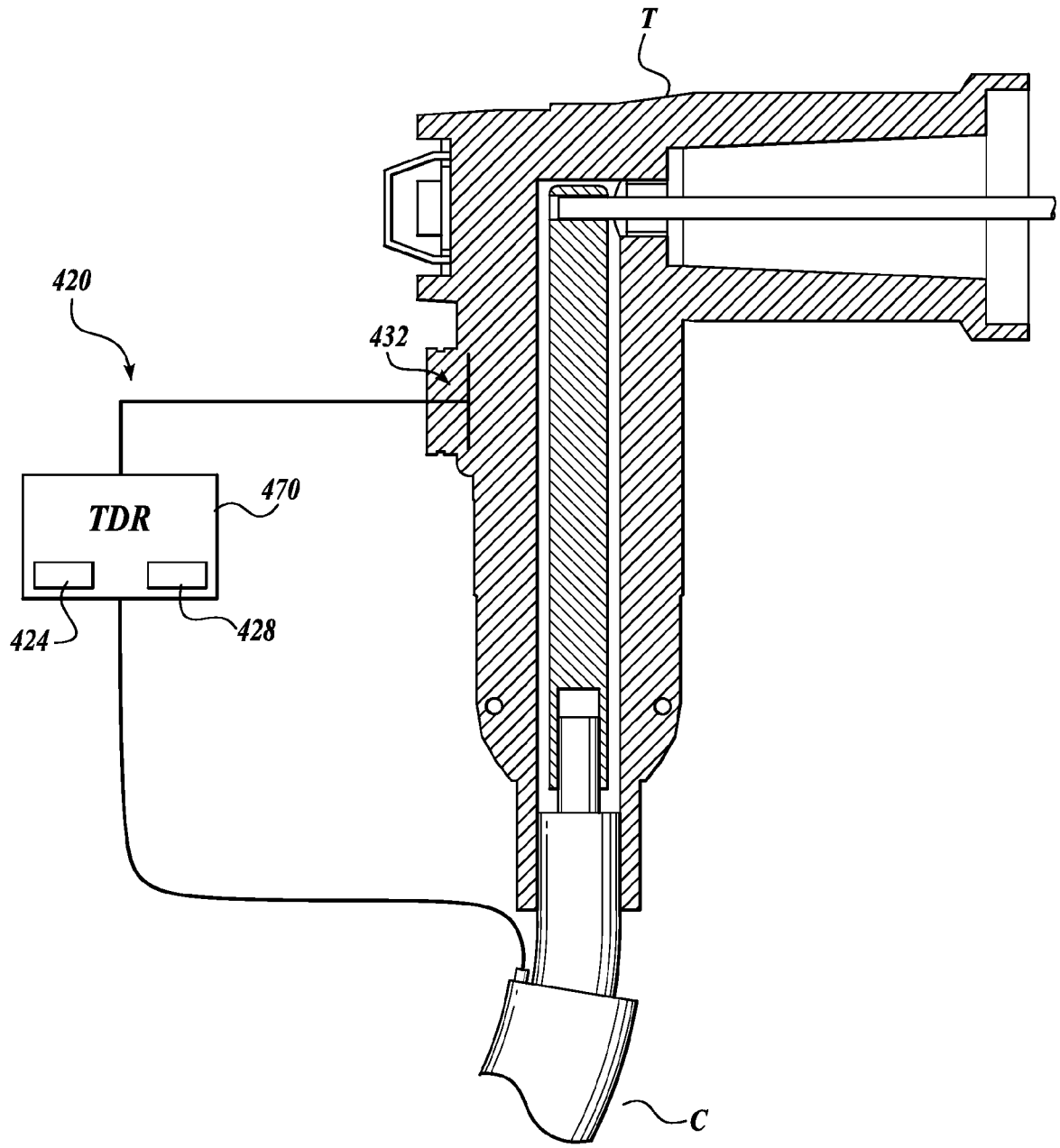
FIG. 6 is a schematic diagram of another embodiment of a TDR system formed in accordance with aspects of the present disclosure.

Turning now to FIG. 6, there is shown another embodiment of a TDR testing system, generally designated 420, formed in accordance with aspects of the present disclosure. The system 420 is substantially similar to the system 20 except for the differences that will now be explained. As shown in FIG. 1, the sensor 32 of the TDR system 20 is capacitively coupled to a power cable C to be tested. In contrast to FIG. 1, the sensor 432 of the TDR system 420 shown in FIG. 6 is capacitively coupled to the power cable C at a termination elbow T. In that regard, the sensor 432 is formed integrally with the housing of the termination elbow T and positioned so as to be capacitively coupled to the power cable C when the power cable is connected to the termination elbow. In one embodiment, the sensor 432 is part of a capacitive port on the termination elbow T.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the disclosure in which an exclusive property or privilege is claimed are defined as follows:

1. An apparatus for testing an electrical power system for anomalies, comprising:
    a computing device;
    a pulse generator having an output impedance greater than 500 ohms, the pulse generator configured to generate a pulse upon reception of a command signal from the computing device;
    one or more capacitive test sensors configured to be capacitively coupled to an on-line power component of the electrical power system, wherein at least one of the one or more capacitive test sensors receives the pulse generated by the pulse generator.

2. The apparatus of claim 1, wherein the one or more sensors include a first sensor coupled with the pulse generator that transmits a test pulse to the on-line power component and a second sensor coupled with the computing device that receives a reflected pulse from the on-line power component and transmits the reflected pulse to the computing device.

3. The apparatus of claim 2, further comprising an amplifier coupled in series between the second sensor and the computing device.

4. The apparatus of claim 3, wherein the amplifier has an input impedance of greater than 500 ohms.

5. The apparatus of claim 3, wherein the amplifier is disposed within two inches from the second sensor.

6. The apparatus of claim 1, wherein the computing device and the pulse generator are disposed in a portable unitary housing.

7. The apparatus of claim 1, wherein the pulse generator has an output impedance greater than 1000 ohms.

8. The apparatus of claim 1, wherein the on-line power component is an insulated power cable.

9. The apparatus of claim 1, wherein the sensor is integrated into a power cable termination elbow.

10. The apparatus of claim 8, wherein the insulated power cable includes an insulated medium voltage power transmission cable.

* * * * *